(12) United States Patent
Huang et al.

(10) Patent No.: US 11,916,155 B2
(45) Date of Patent: Feb. 27, 2024

(54) OPTOELECTRONIC PACKAGE HAVING SECOND ENCAPSULANT COVER FIRST ENCAPSULANT AND PHOTONIC DEVICES

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chien-Hsiu Huang, New Taipei (TW); Bo-Jhih Chen, New Taipei (TW); Kuo-Ming Chiu, New Taipei (TW); Meng-Sung Chou, New Taipei (TW); Wei-Te Cheng, Taipei (TW); Kai-Chieh Liang, New Taipei (TW); Yun-Ta Chen, New Taipei (TW); Yu-Han Wang, Changzhou (CN)

(73) Assignees: LITE-ON OPTO TECHNOLOGY (CHANGZHOU) CO., LTD., Changzhou (CN); LITE-ON TECHNOLOGY CORPORATION, Taipei (TW)

(*) Notice: Subject to any disclaimer, the term of this patent is extended or adjusted under 35 U.S.C. 154(b) by 207 days.

(21) Appl. No.: 17/326,356

(22) Filed: May 21, 2021

(65) Prior Publication Data

US 2021/0367086 A1 Nov. 25, 2021

Related U.S. Application Data

(60) Provisional application No. 63/065,547, filed on Aug. 14, 2020, provisional application No. 63/028,617, filed on May 22, 2020.

(30) Foreign Application Priority Data

Dec. 25, 2020 (CN) .......................... 202011566646.8

(51) Int. Cl.
H01L 31/0203 (2014.01)
H01L 31/02 (2006.01)
H01L 31/18 (2006.01)

(52) U.S. Cl.
CPC .... H01L 31/0203 (2013.01); H01L 31/02005 (2013.01); H01L 31/1876 (2013.01)

(58) Field of Classification Search
CPC .......... H01L 31/0203; H01L 31/02005; H01L 31/1876
See application file for complete search history.

(56) References Cited

U.S. PATENT DOCUMENTS 7,777,246 B2 * 8/2010 Hung ...................... H01L 33/56
257/79
2007/0210702 A1 9/2007 Nakamura
(Continued)

FOREIGN PATENT DOCUMENTS

CN 107871789 A 4/2018
EP 0269522 A1 6/1988

*Primary Examiner* — Michael Jung
(74) *Attorney, Agent, or Firm* — Li & Cai Intellectual Property Office

(57) ABSTRACT

An optoelectronic package and a method for producing the optoelectronic package are provided. The optoelectronic package includes a carrier, a photonic device, a first encapsulant and a second encapsulant. The photonic device is disposed on the carrier. The first encapsulant covers the carrier and is disposed around the photonic device. The second encapsulant covers the first encapsulant and the photonic device. The first encapsulant has a topmost position and a bottommost position, and the topmost position is not higher than a surface of the photonic device.

12 Claims, 19 Drawing Sheets

(56) References Cited

U.S. PATENT DOCUMENTS

| | | | |
|---|---|---|---|
| 2008/0231181 A1* | 9/2008 | Pang | H01L 33/505 |
| | | | 313/512 |
| 2011/0170269 A1 | 7/2011 | Blossfeld et al. | |
| 2014/0071689 A1* | 3/2014 | Yoon | H01L 33/54 |
| | | | 362/296.01 |
| 2014/0111992 A1 | 4/2014 | Yeoh et al. | |
| 2016/0254423 A1* | 9/2016 | Bergmann | H01L 33/54 |
| | | | 257/89 |

* cited by examiner

OPTOELECTRONIC PACKAGE HAVING SECOND ENCAPSULANT COVER FIRST ENCAPSULANT AND PHOTONIC DEVICES

CROSS-REFERENCE TO RELATED PATENT APPLICATION

This application claims priorities to the U.S. Provisional Patent Application Ser. No. 63/028,617 filed on May 22, 2020 and Ser. No. 63/065,547 filed on Aug. 14, 2020, and to China Patent Application No. 202011566646.8 filed on Dec. 25, 2020 in People's Republic of China. The entire content of each of the above identified applications is incorporated herein by reference.

Some references, which may include patents, patent applications and various publications, may be cited and discussed in the description of present disclosure. The citation and/or discussion of such references is provided merely to clarify the description of present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to optoelectronics, and more particularly to an optoelectronic package having an encapsulant and a method for producing the optoelectronic package.

BACKGROUND OF THE DISCLOSURE

Heart rate monitors are built-in in smartphones or smart bracelets. The heart rate monitor uses lights (e.g., an infrared light or a red light) through a light-emitting diode (LED) to a human body, and measures lights reflected from the human body by using a photodetector. Through a change in blood flow inferred from the light decreased during reflection, a heart rate or a pulse rate of the human body can be known. Currently, in addition to increasing light-emitting power (i.e., brightness), the photodetector has developed toward being lighter, thinner, shorter, and smaller in size and being power saving. However, in conventional technologies, it is still difficult for the photodetector to achieve the aforementioned requirements due to deficiencies in packaging structure and processing techniques. Therefore, how to overcome the aforementioned deficiencies and achieve the product requirements of power saving and miniaturization through an improvement in structural design has become an important issue to be solved in the field.

SUMMARY OF THE DISCLOSURE

In response to the above-referenced technical inadequacies, the present disclosure provides an optoelectronic package and a method for producing the optoelectronic package.

In one aspect, the present disclosure provides an optoelectronic package, which includes a carrier, a plurality of photonic devices, a first encapsulant, a second encapsulant, and a wall. The first encapsulant covers the carrier and is disposed around the plurality of photonic devices. The second encapsulant covers the first encapsulant and the plurality of photonic devices. The wall is disposed on the carrier and surrounds the plurality of photonic devices, the first encapsulant, and the second encapsulant. The first encapsulant has a topmost position and a bottommost position, and the topmost position is not higher than a surface of any one of the photonic devices.

Therefore, by virtue of "the first encapsulant covering the carrier and being disposed around the photonic device" and "the first encapsulant having a topmost position and a bottommost position, and the topmost position being not higher than the surface of the photonic device", the optoelectronic package and the method for producing the optoelectronic package provided in the present disclosure can improve the brightness of a product, whilst upholding product requirements of being lighter, thinner, shorter, and smaller in size and being power saving.

These and other aspects of present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
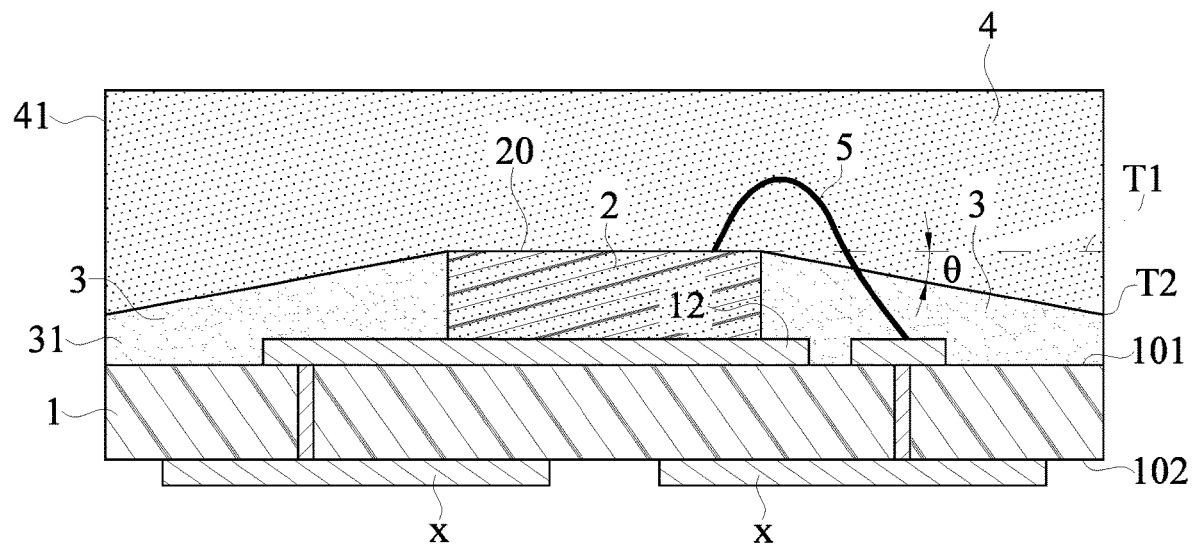
FIG. 1 is a schematic view of a first configuration of an optoelectronic package according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
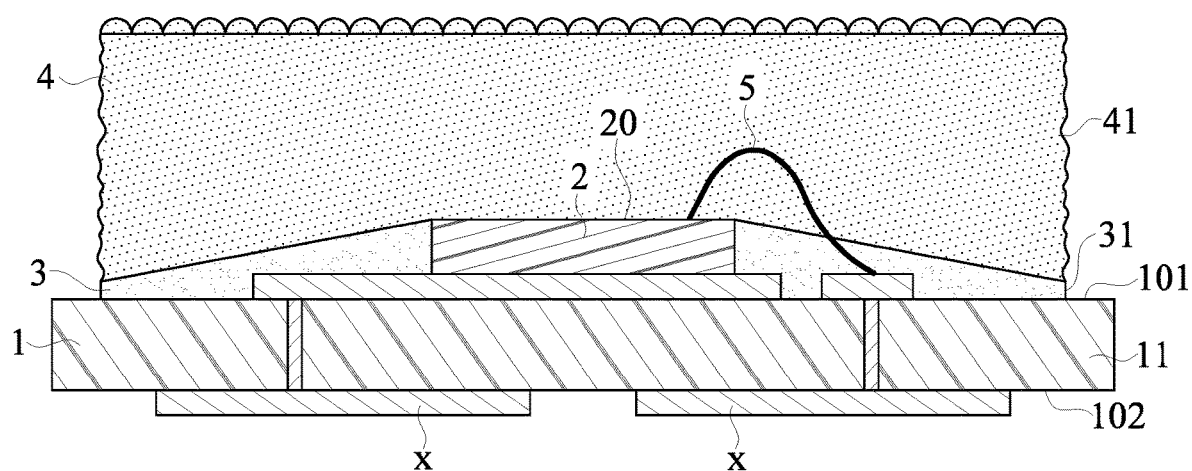
FIG. 2 is a schematic view of a second configuration of the optoelectronic package according to the first embodiment of the present disclosure.

Firstly, referring to FIG. 1 and FIG. 2, a first embodiment of the present disclosure provides an optoelectronic package M1, which includes a carrier 1, a photonic device 2, a first opaque material, and a light-transmitting material. The photonic device 2 is disposed on the carrier 1. Specifically, the carrier 1 may be, for example, a ceramic circuit board, but is not limited thereto. The carrier 1 includes a plurality of metal pads 12, and the photonic device 2 is disposed on one of the metal pads 12. The metal pads 12 are located on one side of the carrier 1 and individually electrically connected to corresponding external electrodes X located on another side of the carrier 1 through inner or outer conductive posts. The first opaque material covers the carrier 1 and is disposed around the photonic device 2 to form a first encapsulant 3 of FIG. 1 and FIG. 2. The light-transmitting material covers the first encapsulant 3 and the photonic device 2 to form a second encapsulant 4 of FIG. 1 and FIG. 2. The first encapsulant 3 has a topmost position T1 and a bottommost position T2, and the topmost position T1 is not higher than a surface 20 of the photonic device 2. A distance between the topmost position T1 and the bottommost position T2 is between 25% and 90% of a height H of the photonic device 2. Specifically, the distance between the topmost position T1 and the bottommost position T2 is between 60% and 80% of the height H of the photonic device 2. A top surface of the first encapsulant 3 is tilted downward from the photonic device 2 and an included angle θ between the surface of the photonic device 2 and a top surface of the first encapsulant 3 is about 20 degrees to 60 degrees. The first opaque material is preferably a reflective material, and can be silicone containing a highly reflective powder, such as polydimethylsiloxane with a highly reflective powder. The highly reflective powder can be zirconium oxide ($ZrO_2$), titanium oxide ($TiO_2$) or TEFLON®, depending on a wavelength of light emitted by the photonic device 2. The photonic device 2 can include at least one of laser diodes, light-emitting diodes, photodetectors, photodiodes, and so on.

The optoelectronic package M1 further includes a wire 5, one end of the wire 5 is bonded to the photonic device 2, and another end of the wire 5 is bonded to the carrier 1. The present disclosure adopts a reverse wire-bonding technique, and a height of a bending point of the wire 5 is required to be 50 μm higher than a height of the photonic device 2, so as to prevent the first encapsulant 3 from forming on the surface 20 of the photonic device 2 along the wire 5. It is worth mentioning that, when the optoelectronic package M1 is formed, a side surface 31 of the first encapsulant 3 is level with a side surface 41 of the second encapsulant 4. Furthermore, as shown in FIG. 2, a distance from the side surface 31 of the first encapsulant 3 and the side surface 41 of the second encapsulant 4 to a side surface 11 of the carrier 1 is greater than 50 μm. That is, widths of the first encapsulant 3 and the second encapsulant 4 are less than a width of the carrier 1. Compared with FIG. 1, an amount of the first encapsulant 3 and the second encapsulant 4 in the optoelectronic package M1 is less. Therefore, the light emitted from the photonic device 2 passing through the first encapsulant 3 and the second encapsulant 4 and being absorbed by the resin is relatively less, such that luminance can be increased. In addition, when the second encapsulant 4 is formed, a roughened release film is formed on the surface of the second encapsulant 4, so as to increase light brightness. Specifically, a surface roughness of the second encapsulant 4 is given as approximately 1.4 μm. However, within a range of about 1 and 2.5 μm, similar effects may be achieved.

Second Embodiment

Figure 3:
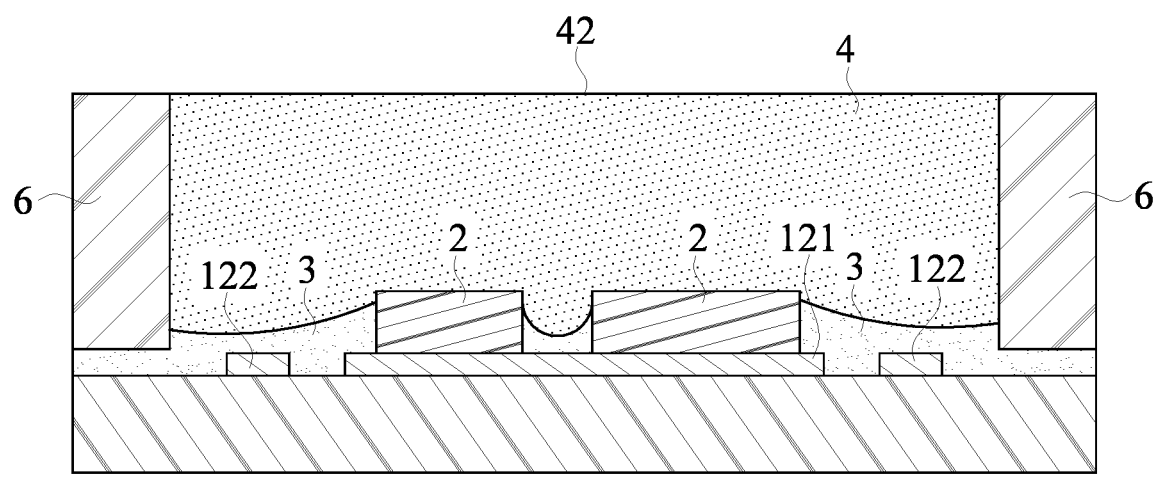
FIG. 3 is a schematic view of a first configuration of the optoelectronic package according to a second embodiment of the present disclosure.
Figure 4:
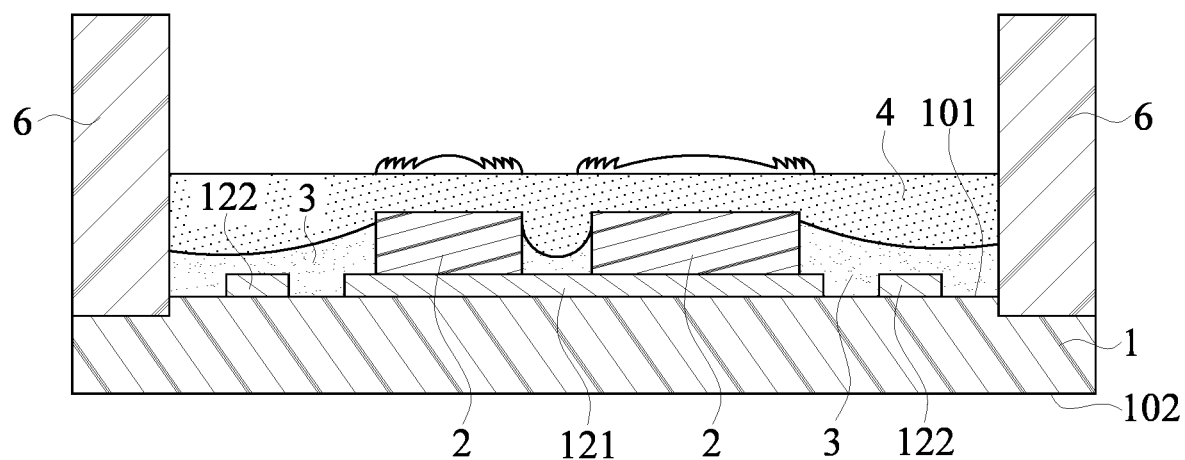
FIG. 4 is a schematic view of a second configuration of the optoelectronic package according to the second embodiment of the present disclosure.
Figure 5:
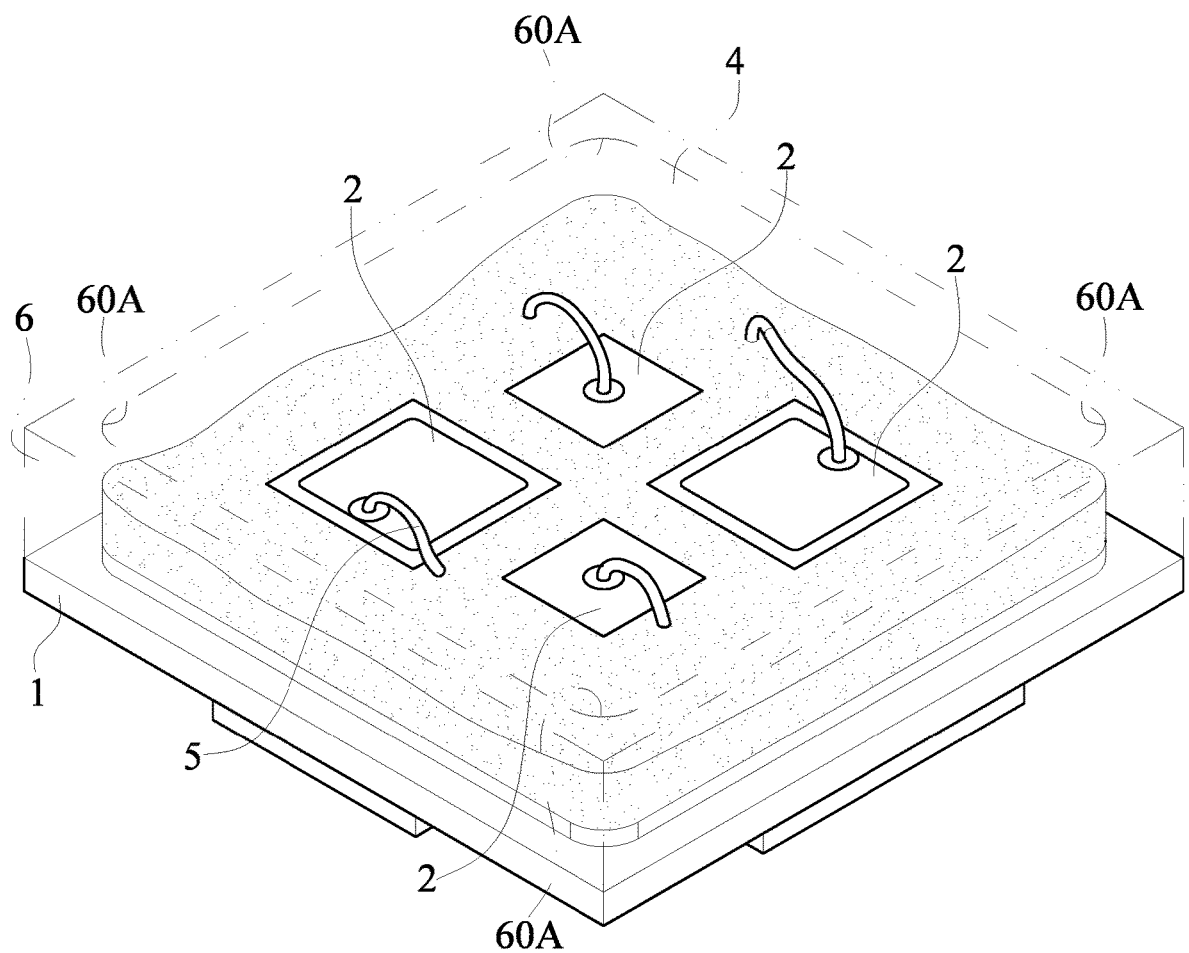
FIG. 5 is a perspective view of the optoelectronic package according to the second embodiment of the present disclosure.
Figure 6:
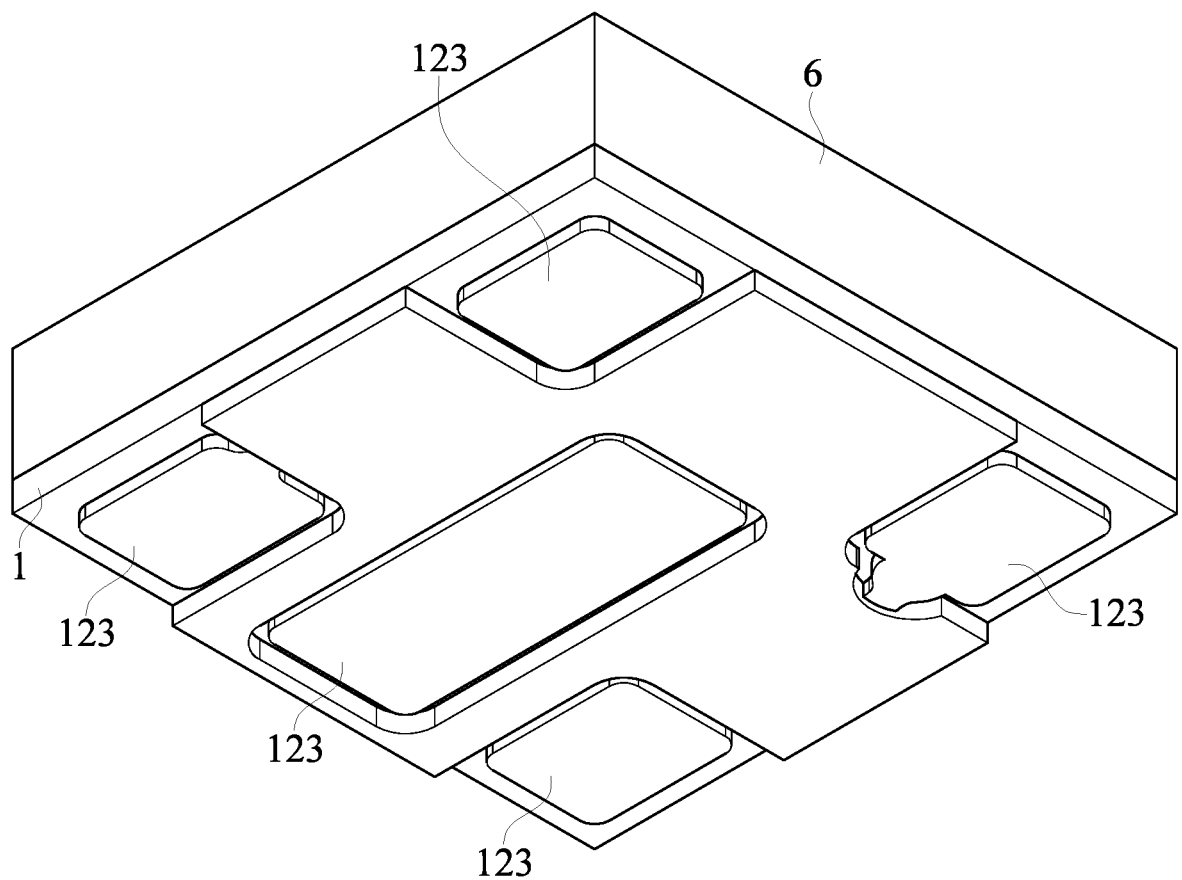
FIG. 6 is another perspective view of the optoelectronic package according to the second embodiment of the present disclosure.

Referring to FIGS. 3 to 6, FIGS. 3 and 4 are cross-sectional side views of an optoelectronic package M2 of a second embodiment of the present disclosure, and FIG. 5 and FIG. 6 are exploded perspective views of the optoelectronic package M2 of the second embodiment of the present disclosure. The second embodiment of the present disclosure provides the optoelectronic package M2, which includes the carrier 1, a plurality of photonic devices 2, the first encapsulant 3, the second encapsulant 4, and the wall 6. The carrier 1 has a top surface 101 and a bottom surface 102, and includes a first metal pad 121 and a plurality of second metal pads 122. The first metal pad 121 and the plurality of second metal pads 122 are disposed on the top surface 101 of carrier 1. The plurality of photonic devices 2 are disposed on the first metal pad 121 and electrically connected to corresponding one of the plurality of second metal pads 122 through a plurality of wires 5. One end of each of the wires 5 is bonded to a corresponding one of the photonic devices 2, and another end of each of the wires 5 is bonded to a corresponding one of the second metal pads 122. The first encapsulant 3 covers the carrier 1 and is disposed around the plurality of photonic devices 2. The second encapsulant 4 covers the first encapsulant 3 and the plurality of photonic devices 2. The wall 6 is disposed on the carrier 1 and surrounds the plurality of photonic devices 2, the first encapsulant 3, the second encapsulant 4, the first metal pad 121 and the plurality of second metal pads 122. The first encapsulant 3 is recessed. Furthermore, also referring to FIG. 17, a top surface of the wall 6 extends inward to cover a part of a top surface of the second encapsulant 4. For example, the top surface of the second encapsulant 4 can be divided into a middle region 4A and an edge region 4B, the middle region 4A and the edge region 4B have a height difference. The middle region 4A of the top surface of the light-transmitting material is a light-emitting/light-receiving region, and is a surface for the light emitted/received by the photonic device 2 to pass through. The edge region 4B of the top surface of the light-transmitting material is the part that is covered by the top surface of the wall 6 that extends inward. The top surface of the wall 6 is level with or higher than the top surface of the light-transmitting material, and the wall 6 is in a shape of an inverted letter L, preferably.

Further, the first encapsulant 3 has a topmost position T1 and a bottommost position T2, and the topmost position T1 is not higher than the surface 20 of the photonic device 2. A curvature of the first encapsulant 3 between any two of the photonic devices 2 is greater than 0.075 mm, and a curvature of the first encapsulant 3 between any photonic device 2 and the wall 6 is greater than 0.17 mm. Thus, an inner part of the first encapsulant 3 formed between the plurality of photonic devices 2 is recessed deeper than an outer part of the first encapsulant 3. For example, when a quantity of the photonic devices 2 is four, a curvature of the first encapsulant 3 between any two of the photonic devices 2 is greater than 0.09 mm, and a curvature of the first encapsulant 3 between any photonic device 2 and the wall 6 is greater than 0.16 mm A material of the wall 6 can be silicone or epoxy resin.

As shown in FIG. 3, a top surface 42 of the second encapsulant 4 may be a flat surface, and may be level with the wall 6 or higher than the bending points of the wires 5. Or the top surface 42 of the second encapsulant 4 may be higher than the top surface of any one of the photonic devices 2 by more than 50 μm, such that the wires 5 are protected. A surface roughness of the top surface 42 is less than 30 nm, and the wire-bonding direction of any one of the wires 5 extends from any one of the second metal pads 122 toward the corresponding photonic device 2. In addition, the top surface 42 of the second encapsulant 4 may be in a lens-like shape corresponding to any one of the photonic devices 2, and the surface roughness of the top surface 42 is between 1.4 μm and 1.6 μm. Different wire-bonding patterns can be adopted depending on the type of the lens-like shape. As shown in FIG. 4, the top surface 42 of the second encapsulant 4 is in a shape of a Fresnel lens, and the wire-bonding direction of any one of the wires 5 extends from any one of the second metal pads 122 toward the corresponding photonic device 2. In another embodiment, the top surface 42 of the second encapsulant 4 is in a spherical shape (not shown in figures), and the wire-bonding direction of any one of the wires 5 extends from any one of the photonic devices 2 toward the corresponding second metal pad 122. Furthermore, a location of a bottom of the wall 6 can be adjusted according to requirements. As shown in FIG. 3, the bottom of the wall 6 may be located below the top surface of the first encapsulant 3, i.e., directly connected to the first encapsulant 3. Alternatively, as shown in FIG. 4, the bottom of the wall 6 may be located on or within the carrier 1, i.e., directly connected to the carrier 1. In addition, as shown in FIG. 5, an inner side wall 60 of the wall 6 has four curved corners 60A, and each of the four curved corners 60A has a curvature that is less than 0.08 mm. When the bottom of the wall 6 is located above the top surface of the first encapsulant 3, an overall structural strength of the optoelectronic package M2 is improved. When the bottom of the wall 6 is located below the top surface 101 of the carrier 1, light emitted through the first encapsulant 3 by the photonic device 2 is reduced, such that light leakage is reduced.

Figure 7:
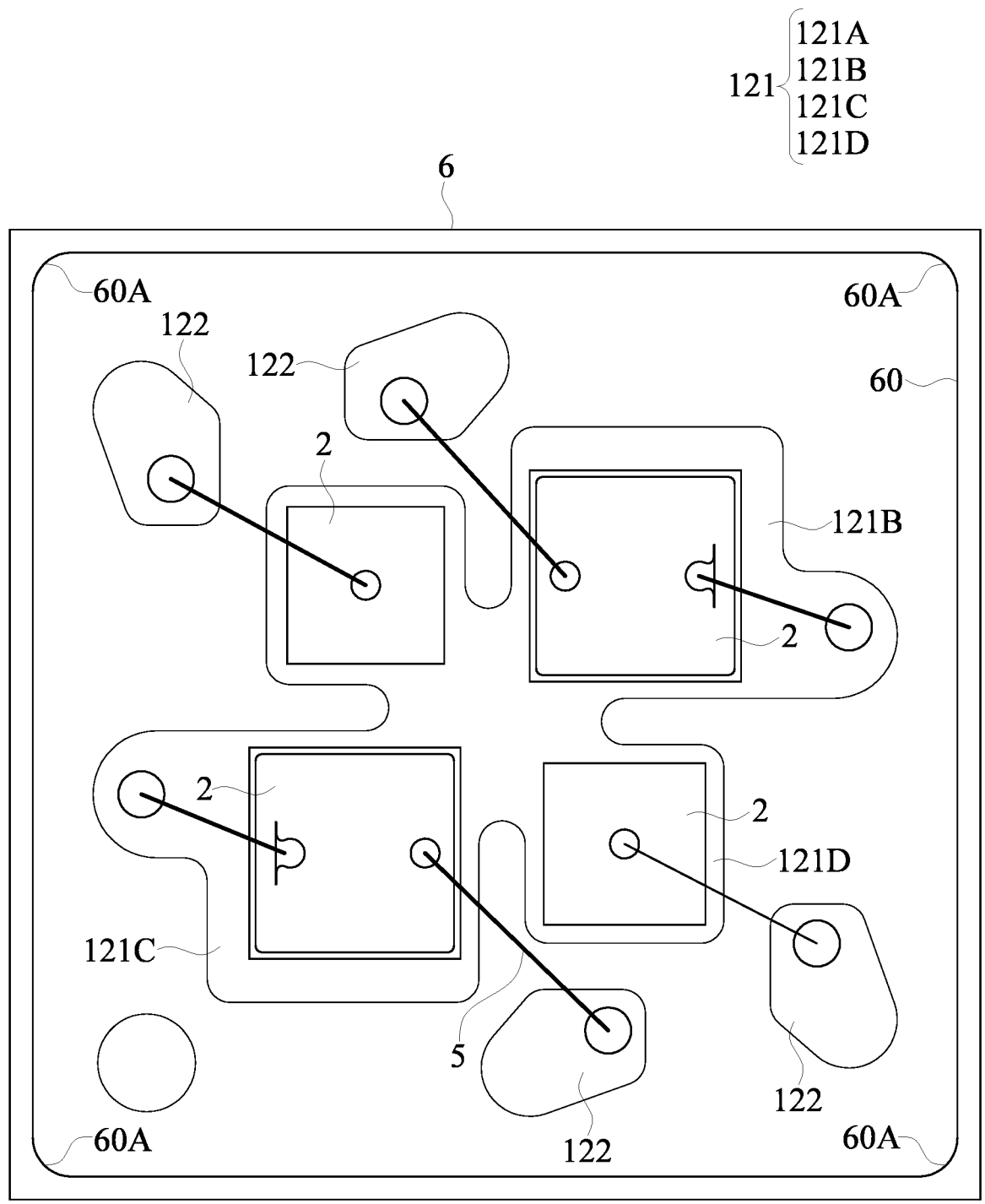
FIG. 7 is a schematic view of a first configuration of a circuit structure of the optoelectronic package according to the second embodiment of the present disclosure.
Figure 8:
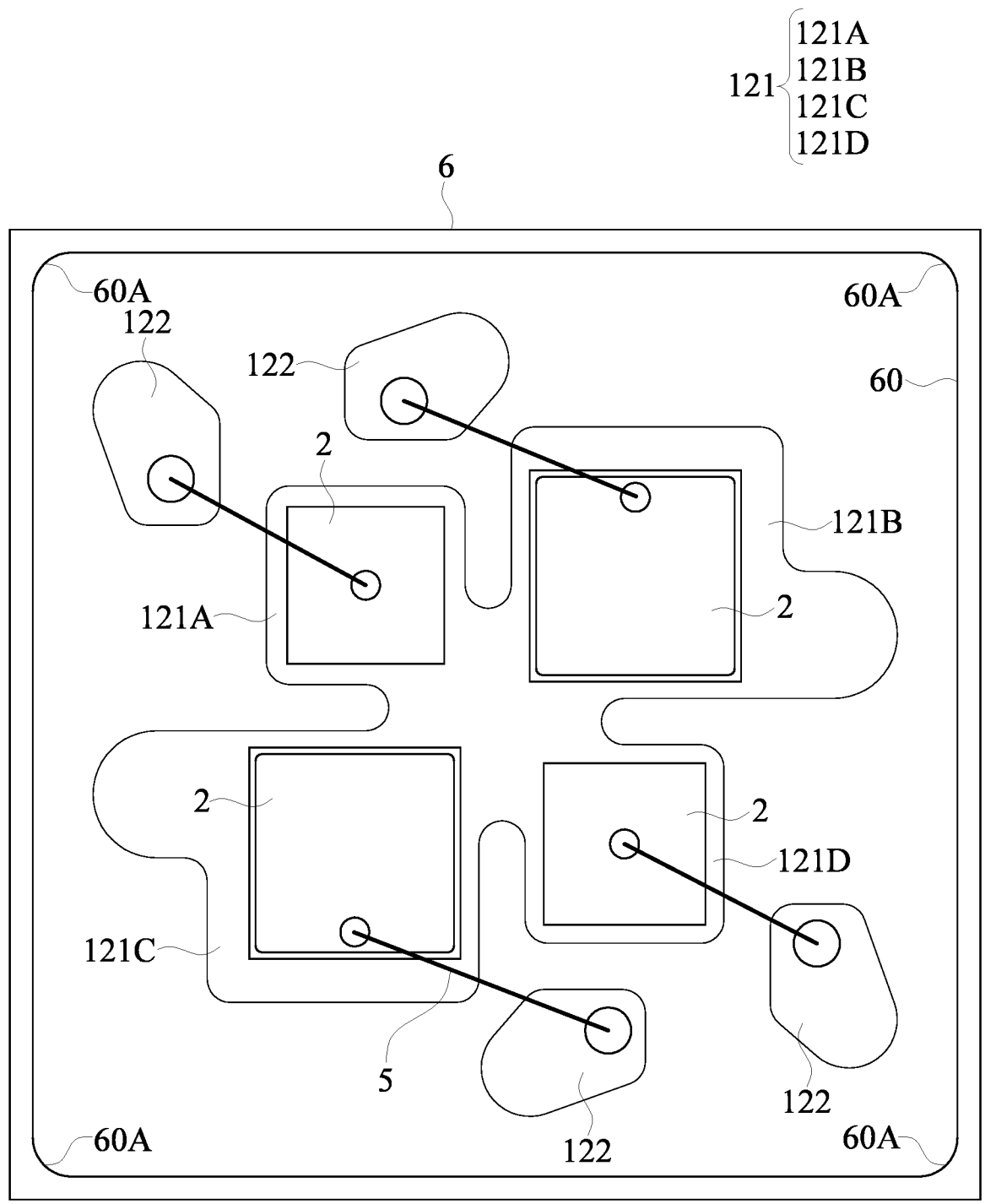
FIG. 8 is a schematic view of a second configuration of the circuit structure of the optoelectronic package according to the second embodiment of the present disclosure.
Figure 9:
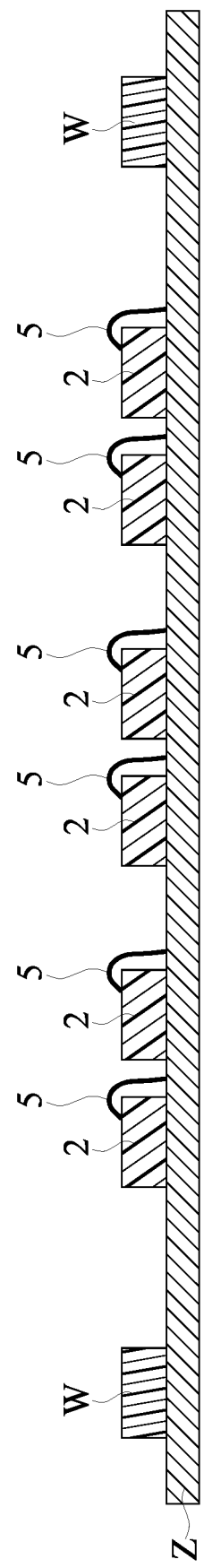
FIG. 9 to FIG. 15 are schematic views showing processes of a method for producing the optoelectronic package according to the second embodiment of the present disclosure.
Figure 10:
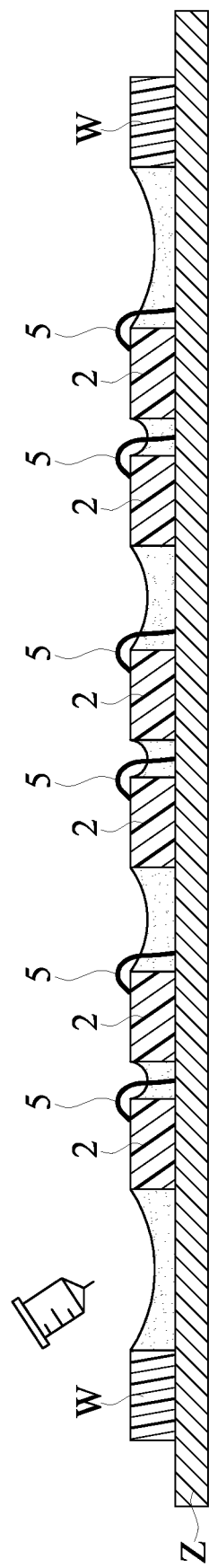
Figure 11:
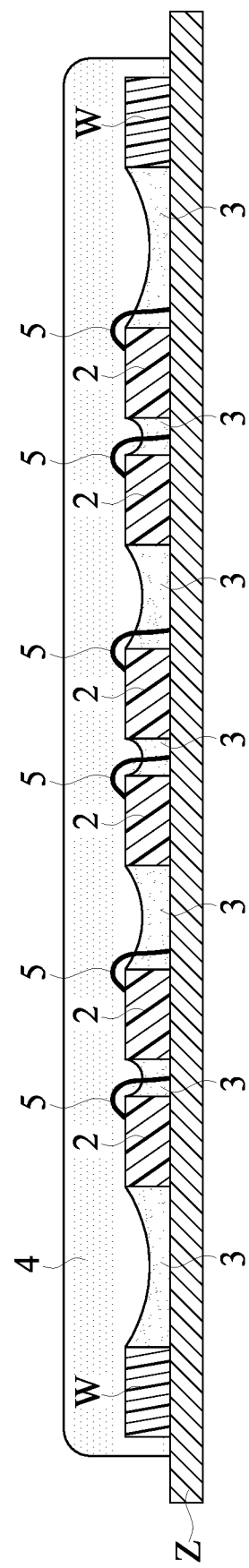
Figure 12:
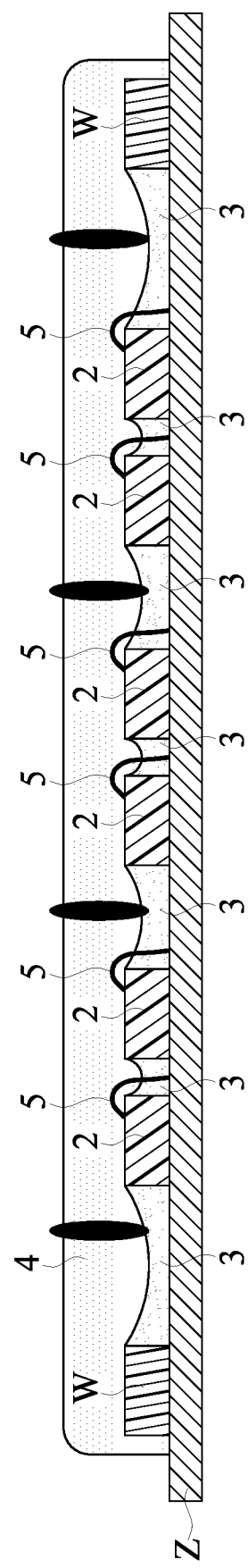
Figure 13:
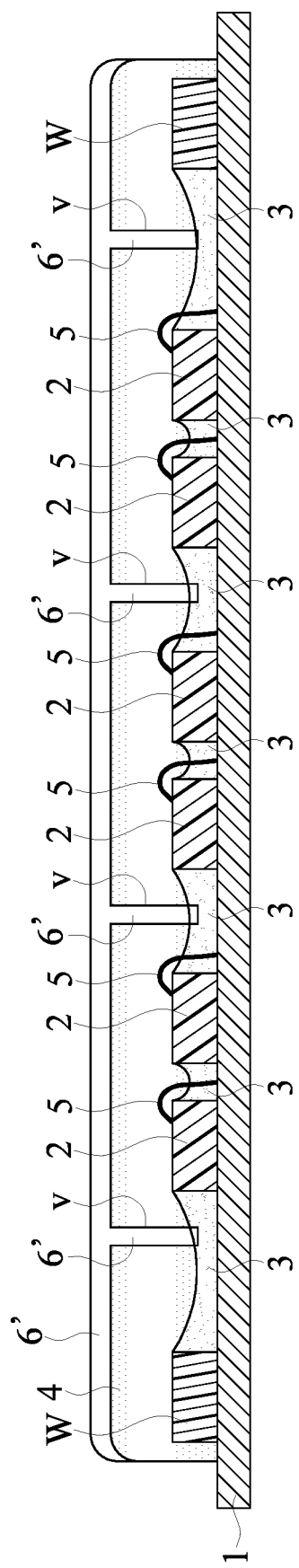
Figure 14:
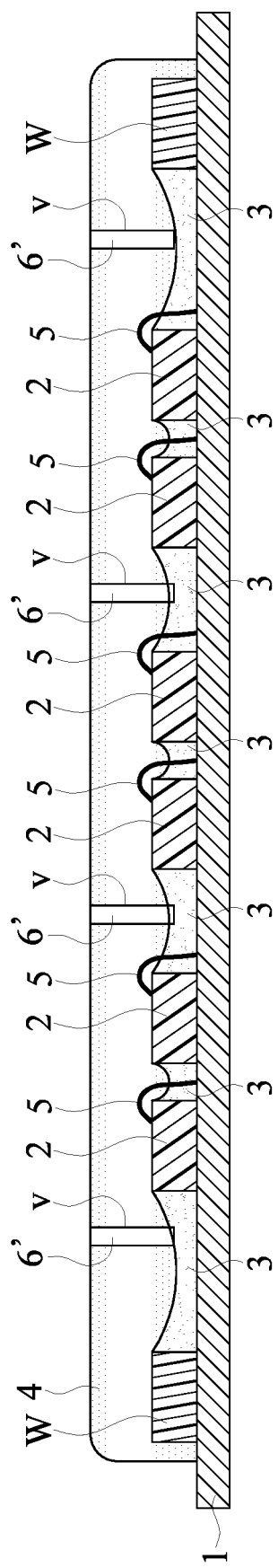
Figure 15:
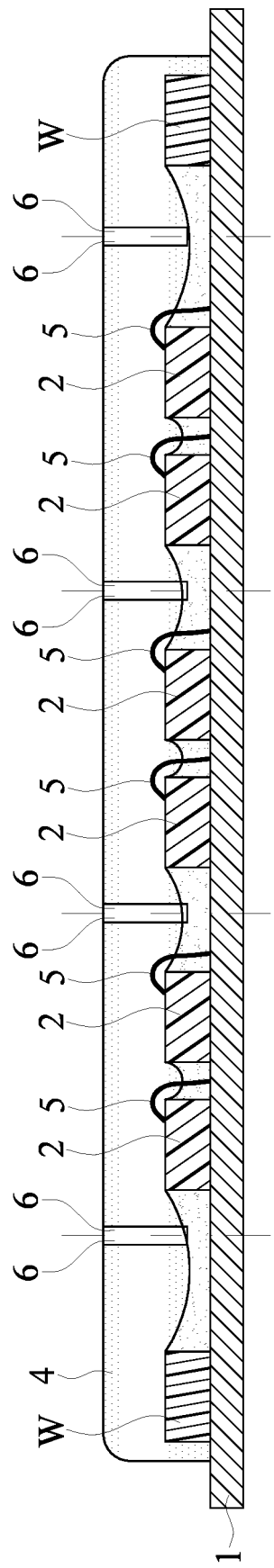

Referring to FIG. 7 and FIG. 8, FIG. 7 and FIG. 8 show a circuit structure of the optoelectronic package M2 of the second embodiment of the present disclosure. Specifically, the first metal pad 121 is an anode, and the second metal pads 122 are cathodes. A quantity of the second metal pads 122 is at least two, in which one of the second metal pads 122 is distributed on an upper left side of the first metal pad 121, and another one of the second metal pads 122 is distributed on a lower right side of the first metal pad 121. Furthermore, the first metal pad 121 has a shape of a four-leaf clover and is divided into four regions including an upper left region 121A, an upper right region 121B, a lower left region 121C, and a lower right region 121D. An area of any of the upper right region 121B and the lower left region 121C is greater than an area of any of the upper left region 121A and the lower right region 121D. At least two of the second metal pads 122 are distributed around the upper left region 121A and at least two of the second metal pads 122 are distributed around the lower right region 121D. The upper right region 121B is symmetrical in shape to the lower left region 121C, and the upper left region 121A is symmetrical in shape to the lower right region 121D.

For example, when the quantity of photonic devices 2 is four, the four photonic devices 2 are located in the four regions, respectively. As shown in FIG. 7 and FIG. 8, the two photonic devices 2 located in the upper left region 121A and the upper right region 121B are electrically connected to the two second metal pads 122 located on the upper left side of the first metal pad 121 by wire-bonding, respectively. The two photonic devices 2 located in the lower left region 121C and the lower right region 121D are electrically connected to the two second metal pads 122 (i.e., the cathodes) located on the lower right side of the first metal pad 121 by wire-bonding, respectively. In addition, since the two photonic devices 2 positioned in the upper right region 121B and the lower left region 121C in FIG. 7 are in horizontal formation, apart from a chip-bonding region, the upper right region 121B and the lower left region 121C of the first metal pad 121 each extend outward to form a bump, and the two photonic devices 2 disposed in the chip-bonding region are electrically connected to the corresponding bumps (i.e., the anodes) of the first metal pad 121 by wire-bonding, respectively. In the embodiment mentioned above, the photonic device 2 can emit light of the same or different wavelengths. For example, the photonic device 2 can contain two first light-emitting units and two second light-emitting units, a first wavelength of the first light-emitting units can be from 500 nm to 550 nm, such as green light emitters, and a second wavelength of the second light-emitting units can be between 660 nm and 940 nm. When the second light-emitting units are red light emitters, the second wavelength can preferably be 660 nm, and when the second light-emitting units are infrared light emitters, the second wavelength can preferably be 940 nm. Therefore, the first wavelength is less than the second wavelength, and the second light-emitting units can also contain both the red light-emitters and the infrared light emitters. Furthermore, the two first light-emitting units are positioned in the upper right region 121B and the lower left region 121C, and the two second light-emitting units are positioned in the upper left region 121A and the lower right region 121D. Since the two photonic devices 2 positioned in the upper right region 121B and the lower left region 121C in FIG. 8 are in vertical formation, the two photonic devices 2 of the upper right region 121B and the lower left region 121C are not electrically connected to the first metal pad 121 by wire-bonding, but are directly in electrical contact with the first metal pad 121 by anode pads (not shown in figures) located in the bottoms of the photonic devices 2.

The optoelectronic package M2 further includes a plurality of third metal pads 123 provided on the bottom surface 102 of the carrier 1. A quantity of the third metal pads 123 is at least three, and if zoning control of light sources is considered, the quantity of the third metal pads 123 is equal to a sum of the quantities of the first metal pad 121 and the second metal pads 122. In other words, when the quantity of the photonic device 2 is four, both the sum of the quantities of the first metal pad 121 and the second metal pads 122 and the quantity of the third metal pads 123 are five. The third metal pads 123, through the conductive post penetrating through the carrier 1, are electrically connected to the first metal pad 121 and the second metal pads 122, respectively.

Figure 19:
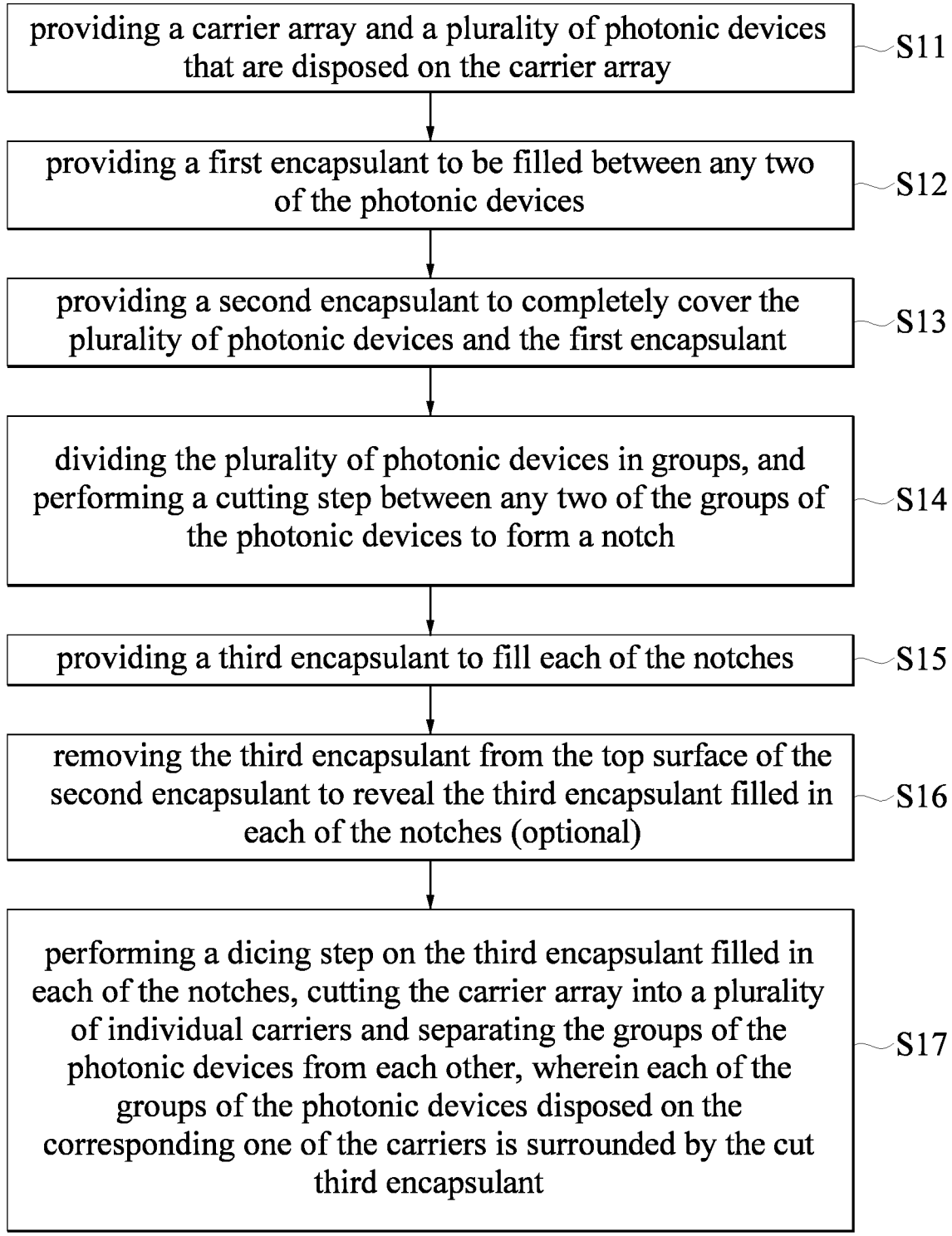
FIG. 19 is a procedural diagram illustrating steps S11 to S17 of the method for producing the optoelectronic package according to the second embodiment of the present disclosure.

References are made to FIGS. 9 to 15, which are schematic views of processes of a method for producing the optoelectronic package according to the second embodiment of the present disclosure. The second embodiment of the present disclosure provides a method for producing the optoelectronic package M2, and the method includes at least the following steps (reference can be made to FIG. 19, which is a diagram illustrating the steps).

Step S11: providing a carrier array Z, and providing a plurality of photonic devices 2 to be disposed on the carrier array Z.

Specifically, the carrier array Z includes a plurality of continuous carriers, one of the carriers includes the first metal pad and the plurality of second metal pads (not shown in figures), and the first metal pad and the plurality of second metal pads are disposed on the top surface of the carrier. A surrounding retaining wall W is positioned on the carrier array Z, and the surrounding retaining wall W provides an accommodating space to accommodate the plurality of photonic devices 2 disposed on the first metal pad, and defines a plurality of gaps distributed in arrays. Next, a wire-bonding process is performed on each of the photonic devices 2. One end of one of the wires 5 is bonded to the corresponding one of the photonic devices 2, and another end of the one of the wires 5 is bonded to the corresponding one of the second metal pads. The wire-bonding direction of any one of the wires 5 extends from any one of the second metal pads toward the corresponding photonic device 2, or from any one of the photonic devices 2 toward the corresponding second metal pad. Generally, in order to prevent an opaque resin from creeping in subsequent processes and then affecting light emission, a bending point of the wires 5 in the reverse wire-bonding process has to be higher than a top of the photonic devices 2 for about 50 μm. In addition, the surrounding retaining wall W can be formed integrally with the carrier array Z, and can also be defined by using a removable temporary resin.

Step S12: providing a first encapsulant 3 to be filled between any two of the photonic devices 2.

In step S12, the first encapsulant 3 is filled around each of the photonic devices 2 in a dot dispensing manner. More specifically, on the carrier array Z, the first encapsulant 3 is dispensed continuously in an array in a dotted manner around each of the photonic devices 2. A baking process is then performed, so that the resin flows in the gaps distributed between the surrounding retaining wall W and the array of photonic devices 2. The first encapsulant 3 is recessed, and has a topmost position T1 and a bottommost position T2. The topmost position T1 is not higher than the surface 20 of each of the photonic devices 2. Specifically, a curvature of the first encapsulant 3 between any two of the photonic devices 2 is greater than 0.075 mm, and a curvature of the first encapsulant 3 between any of the photonic devices 2 and the wall 6 is greater than 0.16 mm A material of the first encapsulant 3 can be an opaque material, e.g., a highly reflective material having a reflectivity of more than 95%, such as a white resin, or the first encapsulant 3 can be a highly light-absorber material, such as a dark resin. The dark resin can be a transparent resin such as epoxy, silicone including dark/black filler, but not limited to: carbon black, black phosphor, or $MoS_2$.

Step S13: providing a second encapsulant 4 to completely cover the plurality of photonic devices 2 and the first encapsulant 3.

Specifically, the second encapsulant 4 completely covers the plurality of photonic devices 2 and the first encapsulant 3 by molding. For example, the top surface 42 of the second encapsulant 4 can be formed as a flat surface or a spherical surface, or formed to have a shape of a Fresnel lens, and the second encapsulant 4 is a light-transmissive resin.

Step S14: dividing the plurality of photonic devices 2 in groups, and performing a cutting step between any two of the groups of the photonic devices 2 to form a notch V.

Specifically, a bottom of the notch V can be lower than the top surface of the first encapsulant 3 (i.e., the sawing-stopped point is at the first encapsulant 3), so that a part of the first encapsulant 3 is exposed from the bottom of the notch V. The bottom of the notch V can also be lower than the top surface of the carrier 1 (i.e., the sawing-stopped point is at the carrier 1), so that a part of the carrier 1 is exposed from the bottom of the notch V.

Step S15: providing a third encapsulant 6' to fill each of the notches V. Furthermore, the third encapsulant 6' is directly connected to a part of the first encapsulant 3 or the carrier 1 exposed from the notch V. Specifically, the third encapsulant 6' can be an opaque material formed by molding or dispensing. That is, the third encapsulant 6' can have a material that is the same as or different from that of the first encapsulant 3. For example, the third encapsulant 6' can be a highly reflective material having a reflectivity of more than 95%, such as a white resin, or the third encapsulant 6' can be a highly light-absorber material, such as a dark/black resin. The dark/black resin can be a transparent resin such as epoxy, silicone including dark/black filler, but not limited to: carbon black, black phosphor, or $MoS_2$.

When the part of the first encapsulant 3 is exposed from the bottom of the notch V, the third encapsulant 6' is connected to the part of the first encapsulant 3 exposed from the bottom of the notch V. When a part of the carrier 1 is exposed from the bottom of the notch V, the third encapsulant 6' is connected to the part of the carrier 1 exposed from the bottom of the notch V.

Step S16: removing the third encapsulant 6' from the top surface of the second encapsulant 4 to reveal the third encapsulant 6' filled in each of the notches V.

Step S17: performing a dicing step on the third encapsulant 6' filled in each of the notches V to cut the carrier array Z into a plurality of individual carriers 1 and to separate the groups of the photonic devices 2 from each other, in which each of the groups of the photonic devices 2 is disposed on the corresponding one of the carriers 1, respectively, and the third encapsulant 6', after being cut, forms the wall 6 surrounding each of the groups of the photonic devices 2.

The quantity of the photonic devices 2 in each group can be two, three or four, and the present disclosure is not limited thereto. The location of the bottom of the wall 6 is decided by the depth of the notch V. When the bottom of the notch V is deeper than the top surface of the first encapsulant 3, the bottom of the wall 6 may be located below the top surface of the first encapsulant 3. If the bottom of the notch V is deeper than the top surface of the carrier 1, the bottom of the wall 6 may be located below the top surface of the carrier 1, i.e., be directly connected to the carrier 1.

The cutting step includes cutting the first encapsulant 3 between any two groups of photonic devices 2 with a first blade, and the dicing step includes sawing the carrier array Z with a second blade, wherein the second blade is softer and thinner than the first blade. Thus, a first sawing groove formed by the cutting step is greater than a second sawing groove formed by the dicing step.

Figure 16A:
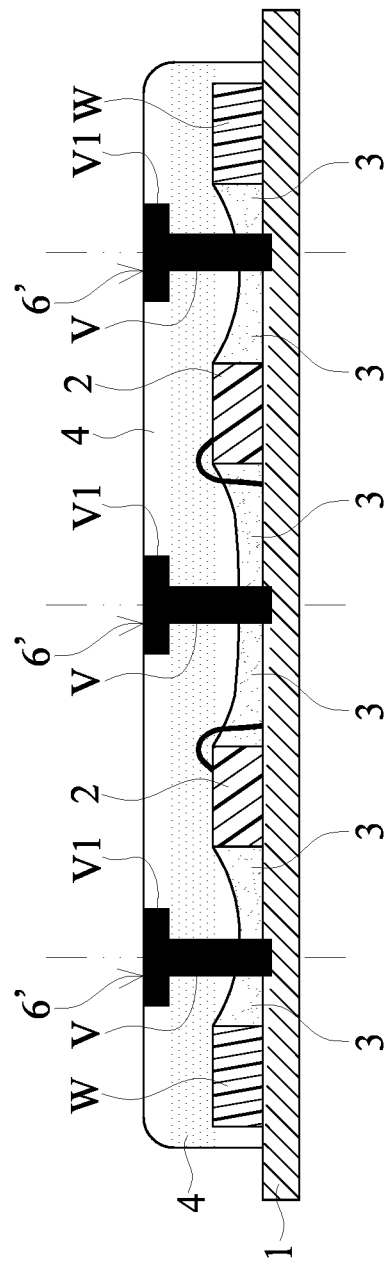
FIG. 16A and FIG. 16B are schematic views of another implementation of step S15 of the method for producing the optoelectronic package according to the second embodiment of the present disclosure.
Figure 16B:
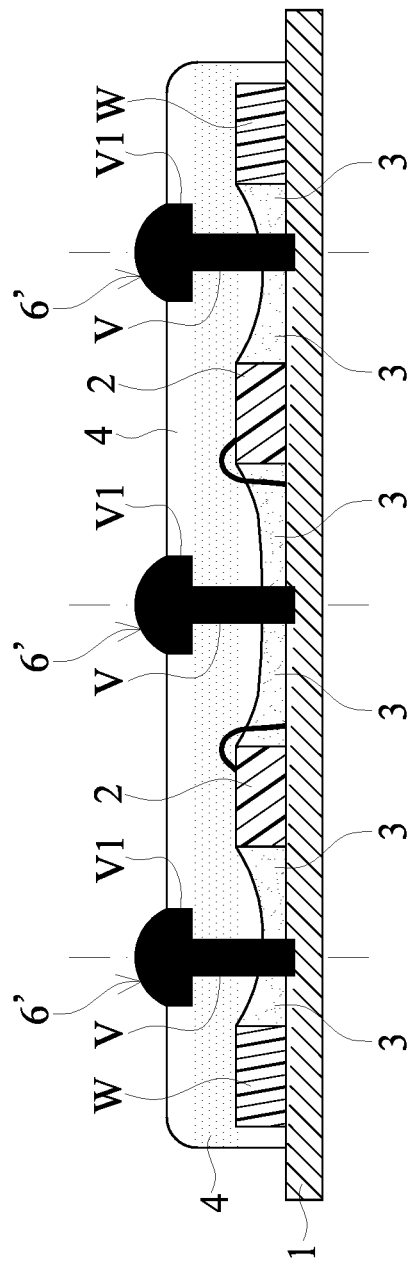
Figure 17:
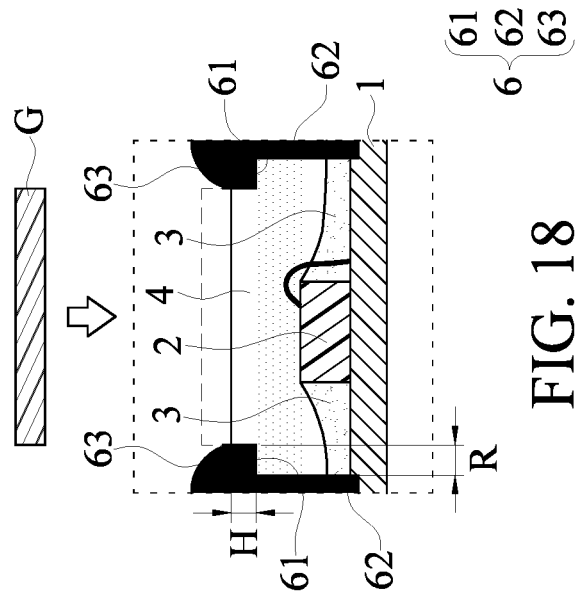
FIG. 17 and FIG. 18 are schematic views of another implementation of step S17 of the method for producing the optoelectronic package according to the second embodiment of the present disclosure.
Figure 18:
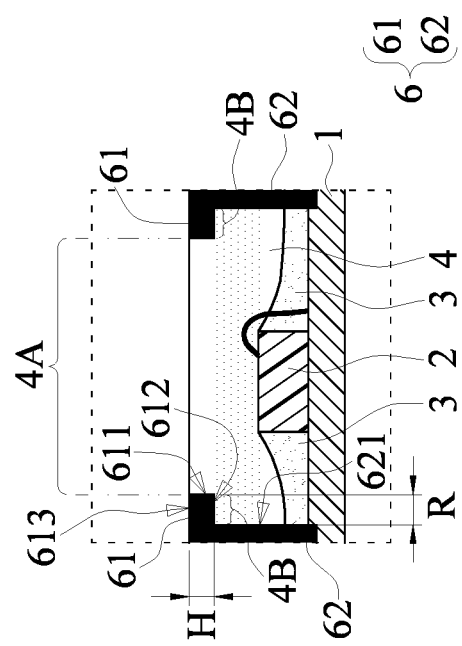

Moreover, reference is made to FIG. 16A and FIG. 16B, and to FIG. 17 and FIG. 18, which show different implementations of the method for producing the optoelectronic package M2. In step S14, the plurality of photonic devices 2 are divided in groups, a quantity of the photonic devices 2 in each of the groups being at least one, and a cutting step is performed between any two of the groups of the photonic devices 2 to form a notch V. The notch V that is formed can have a stair structure, and the bottom of the notch V is preferably to be deeper than the top surface of the carrier 1. Therefore, when the third encapsulant 6' is filled in each of the notches V in step S15, the stair structure of the notch V can increase the area of a joined surface between the third encapsulant 6', the second encapsulant 4 and the carrier 1, thereby enhancing the joint strength and improving process yield.

Furthermore, the step S16 of removing the third encapsulant 6' from the top surface of the second encapsulant 4 is omitted in FIG. 16A and FIG. 16B. In the method for producing the optoelectronic package M2, after the notch V having the stair structure having a wide top level and a narrow bottom level is formed, the third encapsulant 6' is dispensed into each of the notches V. Furthermore, when the third encapsulant 6' is filled in each of the notches V by dispensing, vacuum evacuation may be performed so that the third encapsulant 6' can more effectively fill in each of the notches V having a depth reaching the carrier 1. Specifically, as shown in FIG. 16A and FIG. 17, after the third encapsulant 6' is filled in each of the notches V having the stair structure, a structure having a shape of the letter T is formed. A top surface of the third encapsulant 6' is flushed with the top surface of the second encapsulant 4. In step S17 of performing the dicing step on the third encapsulant 6' filled in each of the notches V to cut the carrier array Z into the plurality of individual carriers 1 and to separate the groups of the photonic devices 2 from each other, the third encapsulant 6', after being cut, forms the wall 6 surrounding each of the groups of the photonic devices 2. The top surface of the wall 6 is level with the top surface of the second encapsulant 4. The top surface of the wall 6 extends inward to cover a part of the top surface of the second encapsulant 4 and is in a shape of an inverted letter L, and can be defined into a main part 62 and an extension part 61, and the extension part 61 is connected to one side of the main part 62 and extends inward in a horizontal direction. It should be noted that, the extension part 61 has a width R and a height H. The width R is a distance between a left side surface of the extension part 61 and a right side surface 611. As shown in FIG. 17, since the left side surface of the extension part 61 is connected to one side of the main part 62, the width R is a distance between one side 621 of the main part 62 and the right side surface 611. The height H is a distance between an upper surface 613 and a lower surface 612 of the extension part 61. Preferably, the width R is between 65 µm and 85 µm, and the height H is between 80 µm and 120 µm. More preferably, the width R can be 75 µm and the height H can be 100 µm. That is to say, the third encapsulant 6' extends and covers a part of the second encapsulant 4 exposed on the wide top level of the stair structure within the notch V to limit and control the light emitting region or light receiving region.

Furthermore, as shown in FIG. 16B and FIG. 18, after the third encapsulant 6' is filled in each of the notches V having the stair structure, the third encapsulant 6' not only forms the structure having the shape of the letter T, the top surface of the third encapsulant 6' further protrudes from the top surface of the second encapsulant 4 to form a protruding structure 63. Practically, the top surface of the third encapsulant 6' forms a curved surface (i.e., the top surface of the protruding structure 63 forms a curved surface), and the top surface of the third encapsulant 6' at any position is higher than the top surface of the second encapsulant 4. Since the top surface of the third encapsulant 6' protrudes from the top surface of the second encapsulant 4, the top surface of the wall 6 is higher than the top surface of the second encapsulant 4. Furthermore, in FIG. 18, the top surface of the wall 6 is higher than the top surface of the second encapsulant 4. The shape of the wall 6 in FIG. 18 is similar to a shape of an axe, and the wall 6 can be regarded as the inverted L-shaped structure in FIG. 17 (including the extension part 61 and the main part 62, and the width R and the height H of the extension part 61 are the same as in FIG. 17) further including the axe-like structure formed by the protruding structure 63 being stacked on the inverted L-shaped structure. Furthermore, using the top surface of the second encapsulant 4 as the dividing line, a part of the wall 6 below the top surface of the second encapsulant 4 is the inverted L-shaped structure (including the extension part 61 and the main part 62), and another part of the wall 6 above the top surface of the second encapsulant 4 is the protruding structure 63. Accordingly, referring to FIG. 18, when the top surface of the wall 6 is higher than the top surface of the second encapsulant 4, according to practical requirements, a light-transmissive component G can be provided above each group of photonic devices 2, and the light-transmissive component G is disposed above the second encapsulant 4 and abuts against the protruding structure 63. The light-transmissive component G can be, for example, light filter, phosphor sheet and resin having high refractive index, but it is not limited thereto, and a refractive index of the light-transmissive component G is greater than a refractive index of the second encapsulant 4. In addition, in FIG. 16A and FIG. 16B, FIG. 17 and FIG. 18, the first encapsulant 3 and the third encapsulant 6' both adopt a dark resin (mainly a transparent resin containing carbon black) that has high light-absorbency. It is worth mentioning that, a concentration of carbon black (i.e., a content ratio of carbon black to the black resin) is between 5% and 15%, more preferably, the concentration of carbon black is about 8% to 12%. If the concentration of carbon black is too high, the conductivity will be too high and leakage is prone to occur, and if the concentration of carbon black is too low, the light absorber effect is poor. In the embodiment mentioned above, the photonic device 2 can receive or detect light, for example, the photonic device 2 can be a photodiode.

Beneficial Effects of the Embodiments

One of the beneficial effects of the present disclosure is that, by virtue of "the first encapsulant 3 covering the carrier 1 and being disposed around the photonic device 2" and "the first encapsulant 3 having a topmost position T1 and a bottommost position T2, and the topmost position T1 being not higher than the surface of the photonic device 2", the optoelectronic package and the method for producing the optoelectronic package provided in the present disclosure can improve the brightness of a product, whilst upholding product requirements of being lighter, thinner, shorter, and smaller in size and being power saving.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optoelectronic package, comprising:
   a carrier including at least one first metal pad and a plurality of second metal pads, the first metal pad and the plurality of second metal pads being disposed on a top surface of the carrier;
   a plurality of photonic devices disposed on the first metal pad and electrically connected to corresponding one of the second metal pads;
   a first encapsulant covering the carrier and being disposed around the plurality of photonic devices;
   a second encapsulant covering the first encapsulant and the plurality of photonic devices; and
   a wall disposed on the carrier and surrounding the plurality of photonic devices, the first encapsulant, the second encapsulant, the first metal pad and the plurality of second metal pads;
   wherein the first encapsulant has a topmost position and a bottommost position, and the topmost position is not higher than a surface of any one of the photonic devices;
   wherein the first encapsulant is a reflective resin or an absorber resin and the second encapsulant is a light-transmissive resin.

2. The optoelectronic package according to claim 1, wherein a distance between the topmost position and the bottommost position is between 25% and 90% of a height of the photonic device, and an included angle between the surface of the photonic device and a top surface of the first encapsulant is between 20 degrees and 60 degrees.

3. The optoelectronic package according to claim 1, wherein the first encapsulant has a curvature that is greater than 0.075 mm between any two of the photonic devices, and the first encapsulant has a curvature that is greater than 0.16 mm between the wall and any one of the photonic devices.

4. The optoelectronic package according to claim 1, wherein a top surface of the second encapsulant is a flat surface having a surface roughness of less than 30 nm, or the top surface of the second encapsulant is in a shape of a sphere or a Fresnel lens having a surface roughness of between 1.4 µm and 1.6 µm.

5. The optoelectronic package according to claim 1, wherein a bottom of the wall is located below a top surface of the first encapsulant, on the carrier, or within the carrier.

6. The optoelectronic package according to claim 1, wherein a quantity of the second metal pads is at least two, one of the second metal pads is distributed on an upper left side of the first metal pad, and another one of the second metal pads is distributed on a lower right side of the first metal pad.

7. The optoelectronic package according to claim 1, wherein the first metal pad is divided into four regions, the four regions include an upper left region, an upper right region, a lower left region and a lower right region, an area of any one of the upper right region and the lower left region is greater than an area of any one of the upper left region and the lower right region, and at least two of the second metal pads are distributed around each of the upper left region and the lower right region.

8. The optoelectronic package according to claim 1, wherein a top surface of the wall extends inward to cover a part of a top surface of the second encapsulant.

9. An optoelectronic package, comprising:
   a carrier;
   a photonic device disposed on the carrier;
   a first opaque material covering the carrier and being disposed around the photonic device; and
   a light-transmitting material covering the first opaque material and the photonic device;
   wherein the first opaque material has a topmost position and a bottommost position, and the topmost position is not higher than a surface of the photonic device;
   wherein the optoelectronic package further comprises a wall formed by a second opaque material being disposed on the carrier or the first opaque material, and the second opaque material is a transparent resin contained at least one of carbon black, black phosphor, or $MoS_2$.

10. The optoelectronic package according to claim 9, wherein a top surface of the wall extends inward to cover a part of a top surface of the light-transmitting material.

11. The optoelectronic package according to claim 10, wherein a top surface of the wall is level with or higher than the top surface of the light-transmitting material, and the wall is in a shape of an inverted letter L.

12. The optoelectronic package according to claim 9, wherein a distance between the topmost position and the bottommost position is between 25% and 90% of a height of the photonic device, and an included angle between the surface of the photonic device and a top surface of the first opaque material is between 20 degrees and 60 degrees.

* * * * *